(12) United States Patent
Tu et al.

(10) Patent No.: US 7,195,970 B2
(45) Date of Patent: Mar. 27, 2007

(54) METAL-INSULATOR-METAL CAPACITORS

(75) Inventors: Kuo-Chi Tu, Hsin-Chu (TW); Wai-Yi Lien, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/811,409

(22) Filed: Mar. 26, 2004

(65) Prior Publication Data

US 2005/0212021 A1 Sep. 29, 2005

(51) Int. Cl.
*H01L 27/148* (2006.01)

(52) U.S. Cl. .................... 438/239; 438/241
(58) Field of Classification Search ............. 437/239, 437/241
See application file for complete search history.

(56) References Cited

U.S. PATENT DOCUMENTS

| | | | |
|---|---|---|---|
| 5,598,367 A | 1/1997 | Noble | |
| 5,866,451 A | 2/1999 | Yoo et al. | |
| 6,141,242 A | 10/2000 | Hsu et al. | |
| 6,146,960 A | 11/2000 | Chang | |
| 6,228,703 B1 | 5/2001 | Chang | |
| 6,232,197 B1 | 5/2001 | Tsai | |
| 6,242,300 B1 | 6/2001 | Wang | |
| 6,256,248 B1 | 7/2001 | Leung | |
| 6,306,720 B1 | 10/2001 | Ding | |
| 6,362,041 B1 | 3/2002 | Wang et al. | |
| 6,380,581 B1 | 4/2002 | Noble et al. | |
| 6,399,495 B1 | 6/2002 | Tseng et al. | |
| 6,468,855 B2 | 10/2002 | Leung et al. | |
| 6,492,224 B1 | 12/2002 | Jao | |
| 6,509,595 B1 | 1/2003 | Leung et al. | |
| 6,556,477 B2 | 4/2003 | Hsu et al. | |
| 6,559,493 B2 | 5/2003 | Lee et al. | |
| 2004/0084709 A1* | 5/2004 | Kim et al. | 257/306 |

OTHER PUBLICATIONS

Liu, R., et al., "Single Mask Metal-Insulator-Metal (MIM) Capacitor with Copper Damascene Metallization for Sub-0.18 μm Mixed Mode Signal and System-on-a-Chip (SoC) Applications," IEEE (2000) pp. 111-113.

* cited by examiner

*Primary Examiner*—Long Pham
(74) *Attorney, Agent, or Firm*—Slater & Matsil, L.L.P.

(57) ABSTRACT

A metal-insulator-metal (MIM) capacitor is provided. The bottom electrode of the MIM capacitor is electrically connected to a connection node. The connection node may be, for example, a contact formed in an interlayer dielectric, a polysilicon connection node, a doped polysilicon or silicon region, or the like. A contact provides an electrical connection between the connection node and components formed above the connection node. A second contact provides an electrical connection to the top electrode.

15 Claims, 14 Drawing Sheets

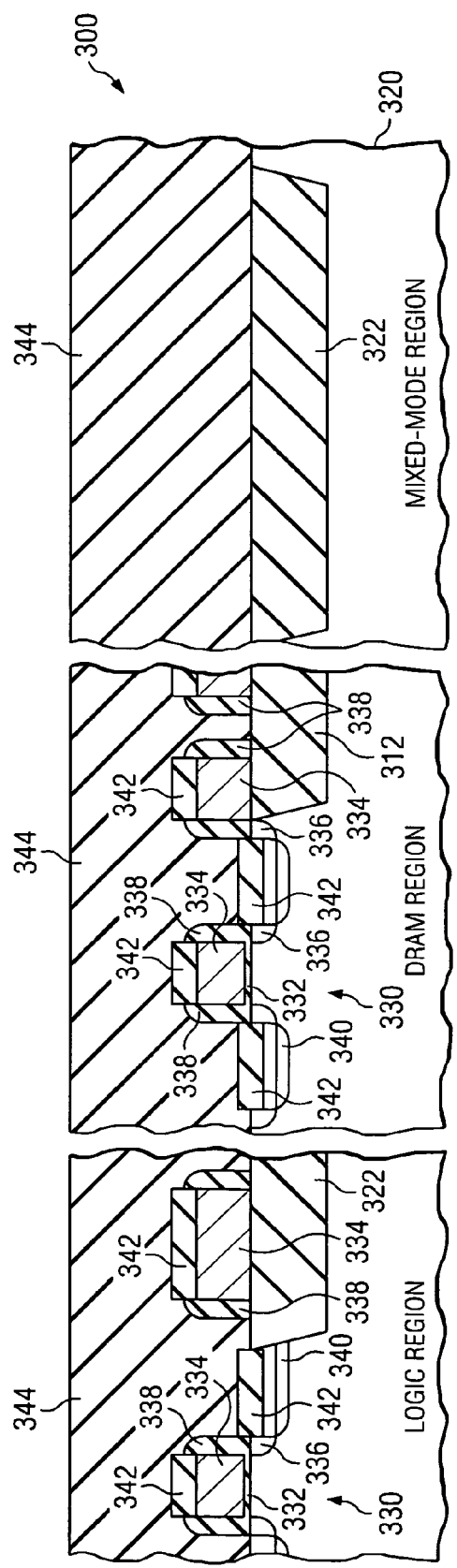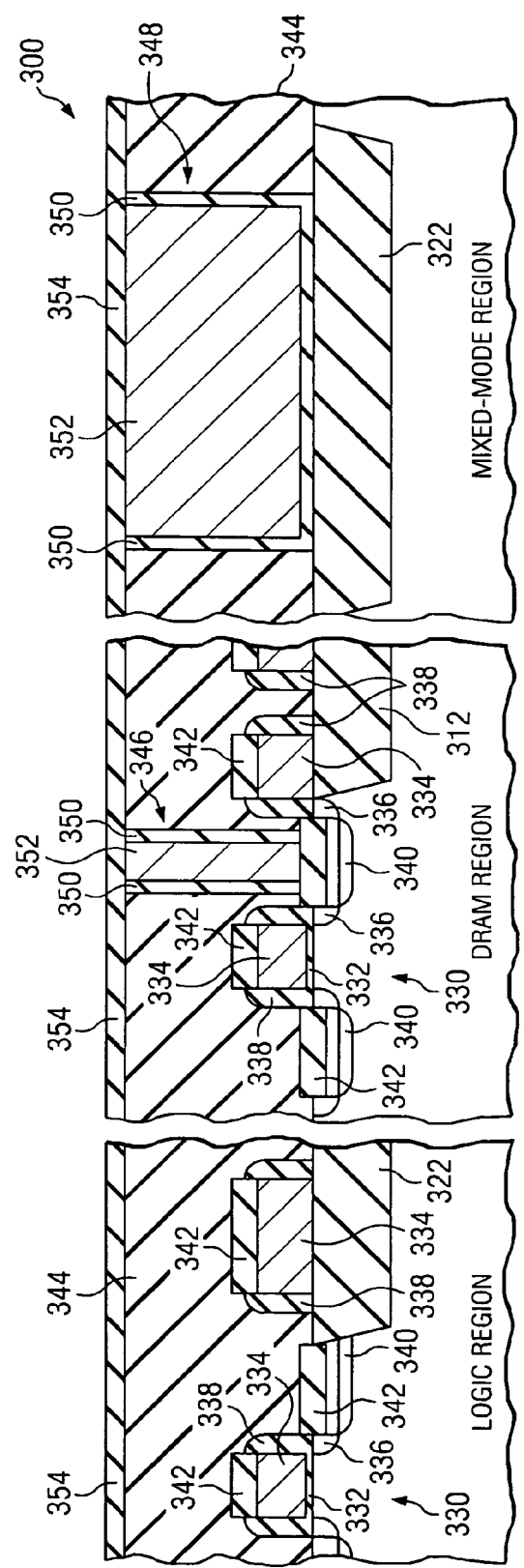
FIG. 3c
FIG. 3d

METAL-INSULATOR-METAL CAPACITORS

TECHNICAL FIELD

The present invention relates to the field of semiconductor devices, and more specifically, to semiconductor devices having a metal-insulator-metal capacitor.

BACKGROUND

With the increasing array density of successive generations of memory chips, it is desirable to incorporate and merge other functions, and thus other devices, onto the memory chips. Many times, however, memory chips incorporating other functions and technologies require additional processing steps to incorporate the other functions on a single chip and, thus, are not cost competitive as compared to the alternative of combining separate chips at the card or package level wherein each is being produced with independently optimized technologies.

For example, mixed-mode signal processing, radio-frequency (RF) signal processing, and system-on-chip (SoC) semiconductor applications often involve integrating capacitors on memory chips. Integrating capacitors onto chips with other semiconductor devices, such as DRAMs, must be performed by adding no or few additional process steps during fabrication in order to keep the devices cost competitive.

One example of a conventional integrated capacitor is shown in FIG. 1, which illustrates a cross-section view of a semiconductor wafer 100 comprising a logic area, a dynamic random access memory (DRAM) area, and a mixed-mode capacitor area. In this case, the mixed-mode capacitor area includes a polysilicon-insulator-polysilicon (PIP) capacitor 116. As is known in the art, a bottom electrode 118 of the PIP capacitor 116 comprises a layer of doped polysilicon, which is typically formed in the same process steps as the polysilicon gate electrodes for the transistors contained in the DRAM area and the logic area. A dielectric layer 120 is formed over the bottom electrode 118, and a top electrode 122 of a doped polysilicon is formed over the dielectric layer. Contact is made to the bottom electrode 118 and the top electrode 122 by vias 124, which are generally filled with copper, tungsten, or the like. As one of ordinary skill in the art will appreciate, this process requires extra processing steps, such as forming the dielectric layer 120 and the top electrode 122, to complete the fabrication of the PIP capacitor. Furthermore, the dielectric layer 120 may easily become damaged during the etching process to form the top electrode 122 and spacers. PIP capacitors formed in this manner are typically characterized by lower capacitance and lower conductance, which limits its applicability in high-speed applications and smaller designs.

FIG. 2a illustrates a cross-section view of a semiconductor wafer 200 having an integrated metal-insulator-metal (MIM) capacitor 208. MIM capacitors are generally more desirable because they provide depletion-free, high conductance electrodes suitable for high speed applications at a lower cost. MIM capacitors also provide scalable storage node capacitors for embedded DRAM designs. Generally, as illustrated in FIG. 2a, the MIM capacitor 208 comprises a metal bottom electrode 210 and a metal top electrode 212 with a stop layer 214 positioned between the bottom electrode 210 and the top electrode 212. The stop layer 214, typically a back-end-of-line stop layer (BEOL) such as $Si_3N_4$, SiC, or the like, acts as the dielectric insulator between the bottom electrode 210 and the top electrode 212. A MIM design such as this requires additional masks and process steps to form the MIM capacitor. Furthermore, the use of the stop layer 214 as the dielectric induces leakage between the top electrode and the bottom electrode, and the MIM capacitor has a tendency to breakdown at the corners of the bottom electrode 210 due to the electric field intensity at these regions.

FIG. 2b is a cross-section view of wafer 250 illustrating another type of a MIM capacitor 252. The MIM capacitor 252 of FIG. 2b is similar to the MIM capacitor 208 of FIG. 2a, except that the insulating layer between bottom electrode 254 and top electrode 256 is a dielectric layer 258, such as an oxide, rather than the stop layer 214 (FIG. 2a). Again, however, the MIM capacitor 252 of FIG. 2b requires additional masks and processing steps to fabricate. Additionally, the process is not easily integrated with a high-K dielectric required for a high capacitance design. The dielectric layer is also easily damaged during the etching process used to form the top electrode.

Thus, there is a need for an integrated capacitor compatible with the standard semiconductor processes.

SUMMARY OF THE INVENTION

These and other problems are generally reduced, solved or circumvented, and technical advantages are generally achieved, by embodiments of the present invention which provides an integrated capacitor compatible with standard semiconductor processing techniques.

In one embodiment of the present invention, a semiconductor device having an integrated capacitor is provided. The integrated capacitor has a top electrode and a bottom electrode with a dielectric layer formed there between. The bottom electrode is in electrical contact with a connection node, which is preferably formed simultaneously with other contacts formed to electrically connect to other semiconductor devices, e.g., transistors. A contact is formed to electrically connect to the connection node, and thus, the bottom electrode of the capacitor. Accordingly, a semiconductor device is formed that allows the fabrication of an integrated capacitor with no or few additional process steps.

In another embodiment, the connection node is formed of polysilicon. In this embodiment, the connection node is preferably formed in the same process steps used to fabricate gate electrodes of transistors. An integrated capacitor may be formed and a contact electrically couples the bottom electrode of the capacitor to the polysilicon connection node. The contact may be formed in the same process steps used to create other contacts to other semiconductor structures, such as transistors.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a–3g are cross section views of a wafer after various process steps of a first method embodiment for fabricating a metal-insulator-metal capacitor in accordance with one embodiment of the present invention.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an integrated capacitor compatible with standard semiconductor processing techniques used to fabricate DRAMs. The invention may also be applied, however, to other designs in which it is desirable to integrate capacitors with other semiconductor devices and designs such as signal processing and system-on-chip applications.

FIGS. 3a–3g illustrate cross-section views of a wafer 300 during various steps of one embodiment of the present invention in which an MIM capacitor is formed. For purposes of illustration, FIGS. 3a–3g illustrate a portion of a logic region, a DRAM region, and a mixed-mode region. Generally, the logic region includes, for example, sense amplifiers, transistors, capacitors, and other logic circuits that control the reading to and writing from the DRAM memory cells contained in the DRAM region. The DRAM region includes, for example, storage capacitors and access transistors. The mixed-mode region includes, for example, devices and structures necessary to provide mixed-mode signal processing, and in particular, integrated MIM capacitors. It should be noted that only a portion of each region is shown in FIGS. 3a–3g, and each region may contain other structures.

Furthermore, it should be noted that the preferred embodiment illustrated in FIGS. 3a–3g depicts distinct and separate regions for the logic region, the DRAM region, and the mixed-mode region for illustrative purposes only. Embodiments of the present invention may be used wherein the regions are spaced apart and/or inter-mixed within one region.

Figure 1:
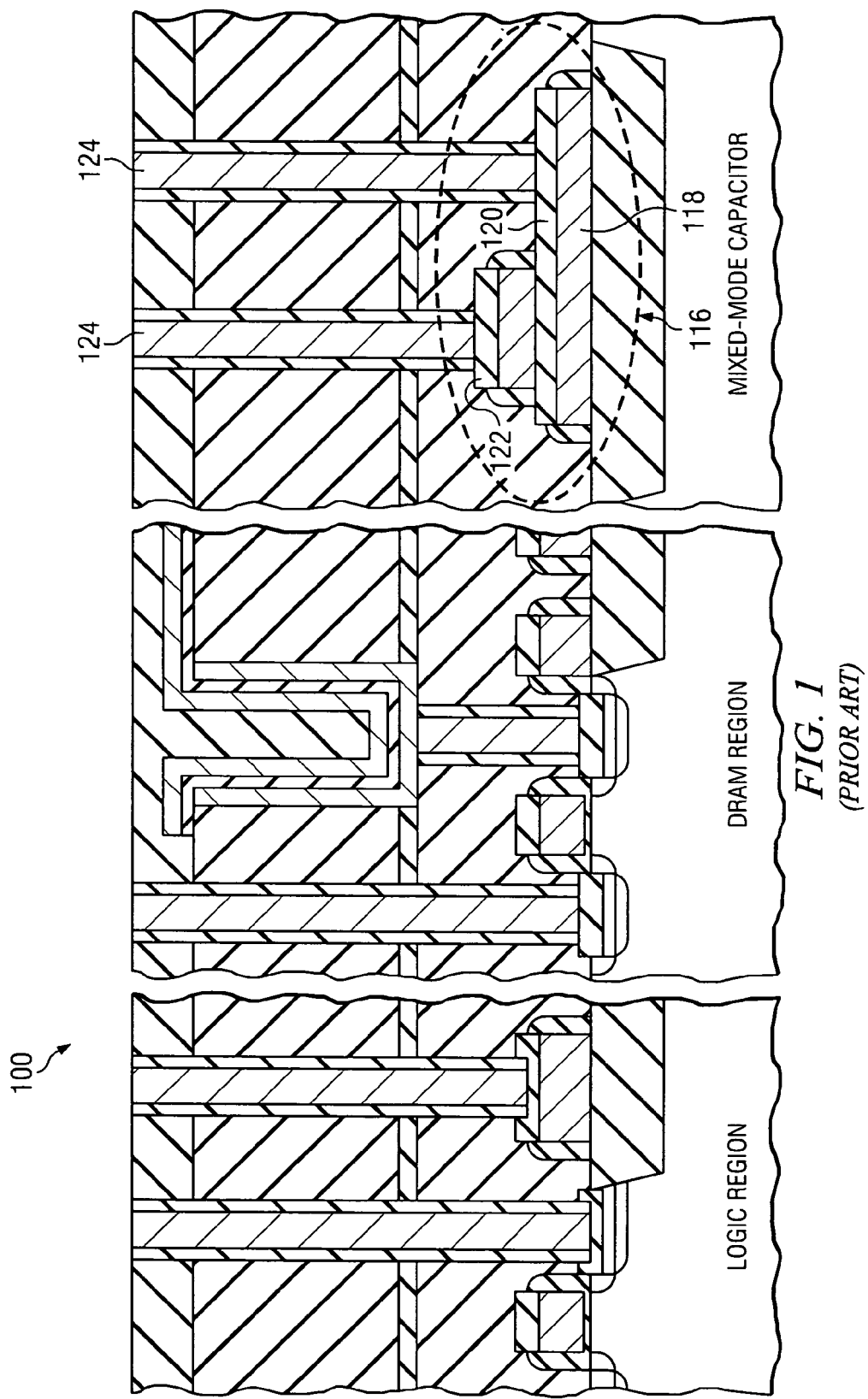
FIG. 1 is a conventional polysilicon-insulator-polysilicon capacitor of the prior art.
Figure 2A:
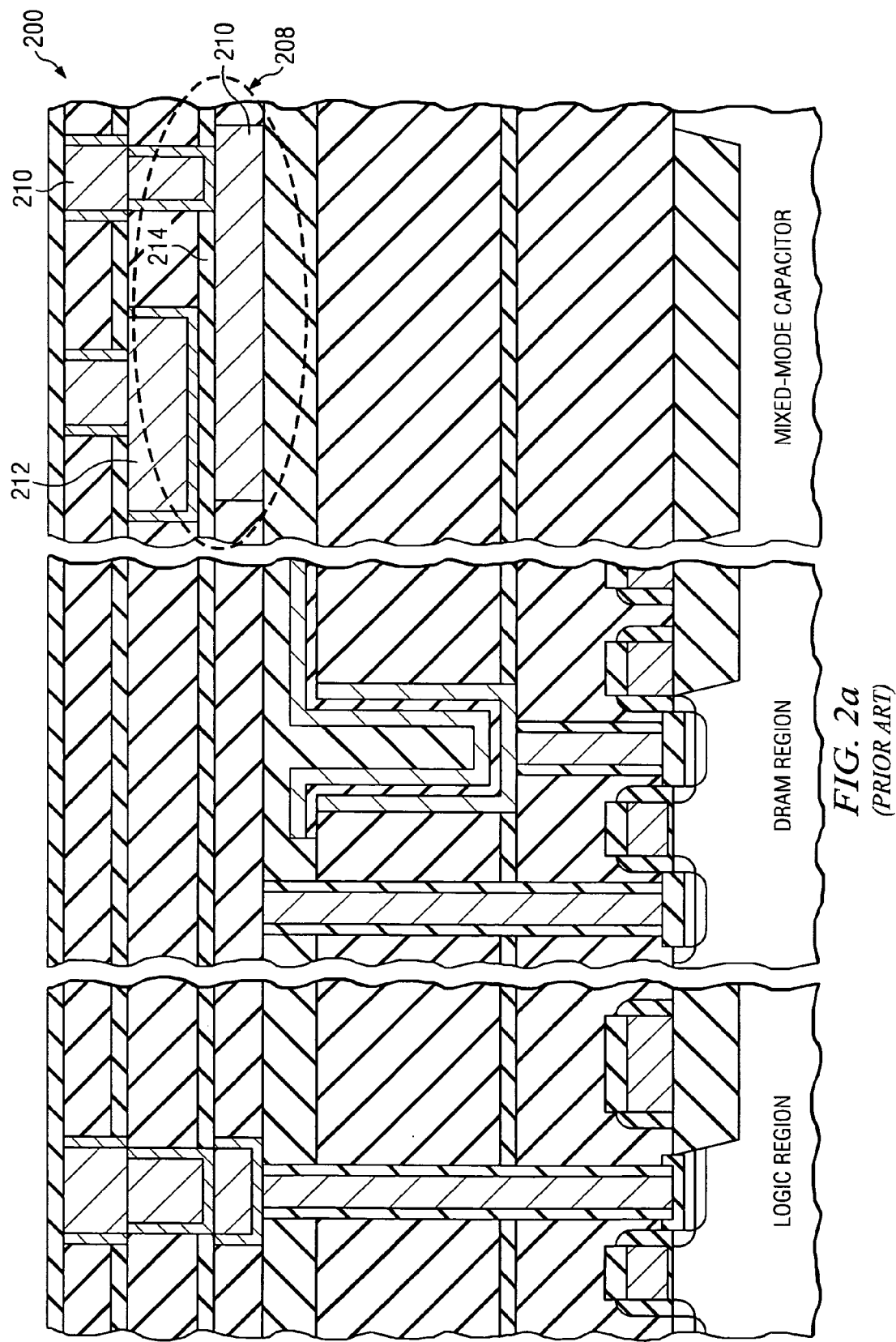
FIGS. 2a–2b are conventional metal-insulator-metal capacitors of the prior art.
Figure 2B:
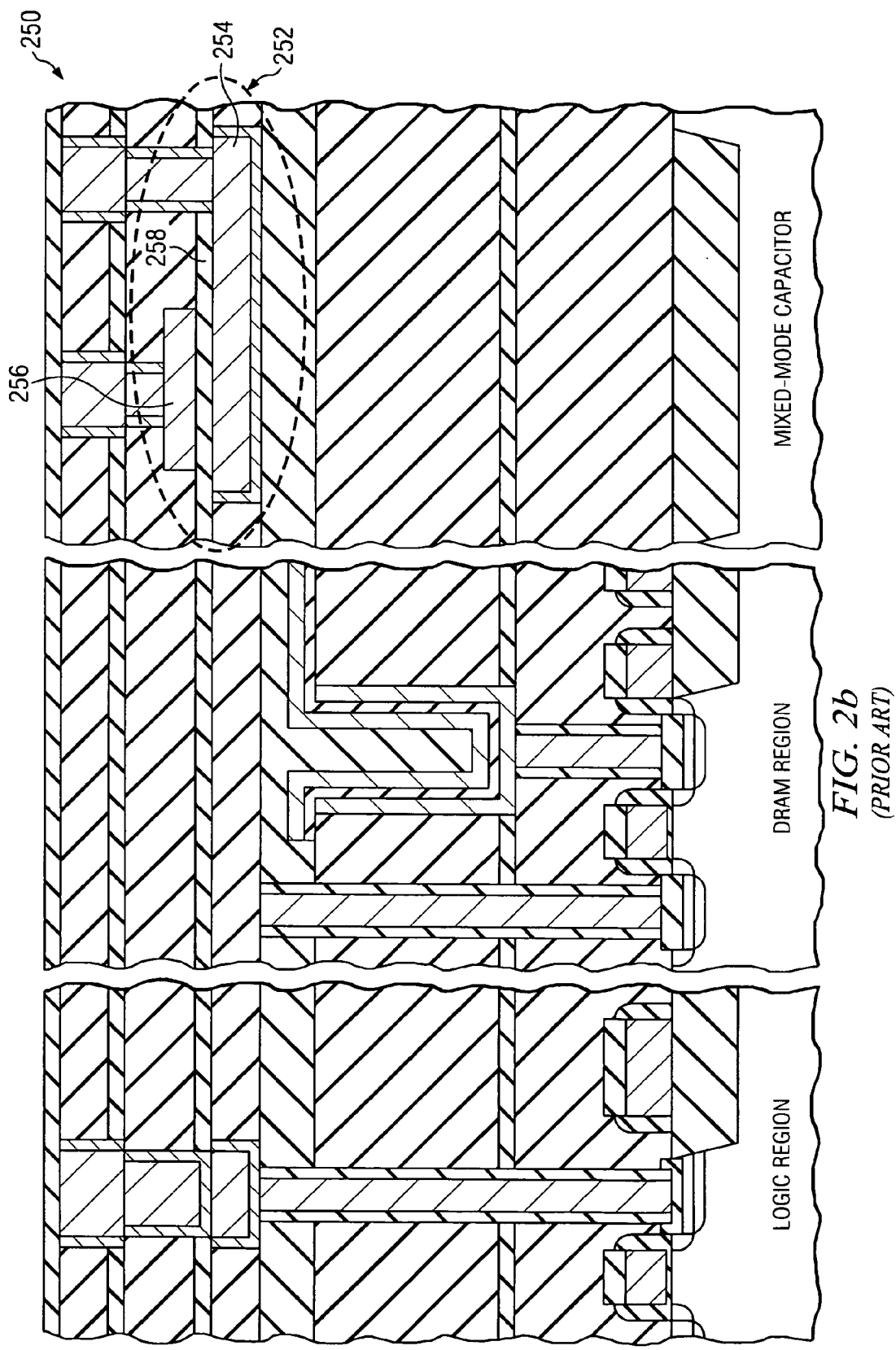
Figure 3A:
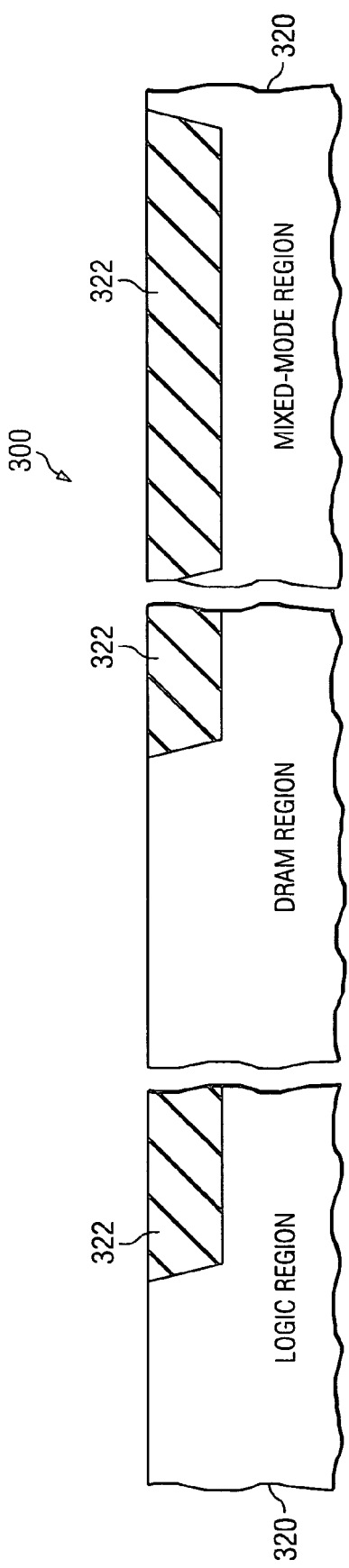

Referring first to FIG. 3a, a wafer 300 has been prepared by forming on a substrate 320 shallow trench isolations (STIs) 322. The substrate 320 is preferably a silicon substrate, which is typically undoped, but may be lightly doped. Other materials, such as silicon-on-insulator (SOI), germanium, quartz, sapphire, and glass could alternatively be used for the substrate 320. The STIs 322 are generally formed by etching the substrate 320 to form a trench and filling the trench with a dielectric material as is known in the art. Preferably, the STIs 322 are filled with a dielectric material such as an oxide material, a high-density plasma (HDP) oxide, or the like, formed by conventional methods. The resulting wafer is planarized, preferably by a chemical-mechanical polishing (CMP) using an oxide slurry, to form the wafer 300 shown in FIG. 3. Furthermore, n-wells and p-wells (not shown) may be formed in the substrate 320.

Figure 3B:
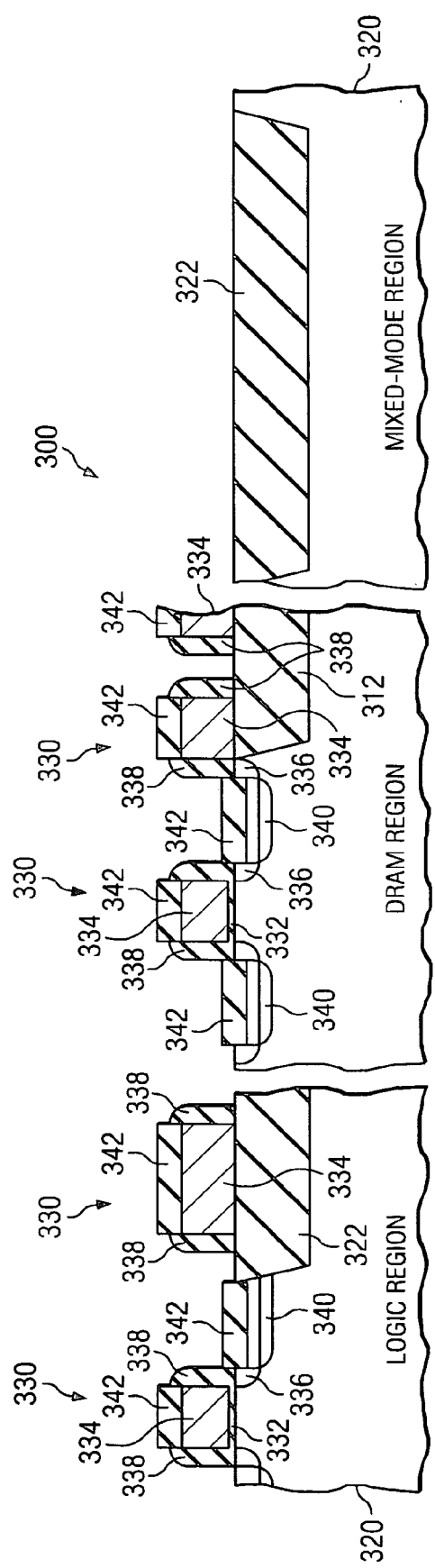

FIG. 3b illustrates the wafer 300 of FIG. 3 after transistors 330 have been formed in accordance with conventional processing steps known in the art. Generally, the formation of transistors 330 involves first forming an oxide layer and a polysilicon layer, which are typically patterned using standard photolithography and etching techniques to form the gate dielectric 332 and gate electrode 334, respectively. Next, a lightly-doped drain (LDD) implant region 336 is formed by implanting the substrate 320 with p-type or n-type ions, wherein the gate electrode 334 acts as a mask. Spacers 338 are formed and second implant region 340 is formed to complete formation of the source/drain regions of the transistors. Additional masks and ion implants may be performed to fabricate transistors having graded junctions. Silicide regions 342 may be formed on the gate electrode 334 and the source/drain regions to provide better contact and to lower contact resistance.

FIG. 3c illustrates the wafer 300 of FIG. 3b after a first interlayer dielectric (ILD) 344 has been formed. Preferably, the first ILD 344 comprises an oxide that may be formed by chemical vapor deposition (CVD) techniques using tetra-ethyl-ortho-silicate (TEOS) and oxygen as a precursor. Preferably, the first ILD 344 is about 4000 Å to about 13000 Å in thickness, but other thicknesses may be used. The surface of the first ILD 344 may be planarized, preferably by a CMP process using an oxide slurry.

FIG. 3d illustrates the wafer 300 of FIG. 3c after contacts 346 and a capacitor contact pad 348 have been formed. Preferably, the first ILD 344 is patterned in accordance with known photolithography and etching techniques. The etching process may be a wet or dry, anisotropic or isotropic etch process, but preferably is an anisotropic dry etch process.

After the first ILD 344 has been patterned, a barrier layer 350 is formed, and the contacts 346 and the capacitor contact pad 348 are filled with a conductive material 352. The barrier layer 350 is preferably formed of titanium nitride, titanium and titanium nitride, or the like deposited by CVD techniques to a thickness of about 50 Å to about 350 Å. The conductive material 352 is preferably a highly-conductive, low-resistive metal, elemental metal, transistion metal, or the like, but preferably is tungsten. In the embodiment in which the conductive material 352 is tungsten, the conductive material may be deposited by CVD techniques known in the art.

It should be noted that the capacitor contact pad 348 is illustrated in FIG. 3d as being formed on a STI 322 within the mixed-mode region for illustrative purposes only. The STI 322 in the mixed-mode region provides an isolation area upon which the capacitor contact pad 348 may be formed. The capacitor contact pad may also be formed on other materials or structures, such as, for example, a silicon substrate.

Afterwards, the wafer 300 is planarized, preferably by a CMP process such that the wafer 300 is planarized to the surface of the first ILD 344. A stop layer 354 is formed over the planarized surface. Preferably, the stop layer 354 is a nitrogen-containing layer, such as $Si_3N_4$, $Si_xN_y$, silicon oxynitride $SiO_xN_y$, silicon oxime $SiO_xN_y:H_z$, or a combination thereof, formed using CVD techniques.

Figure 3E:
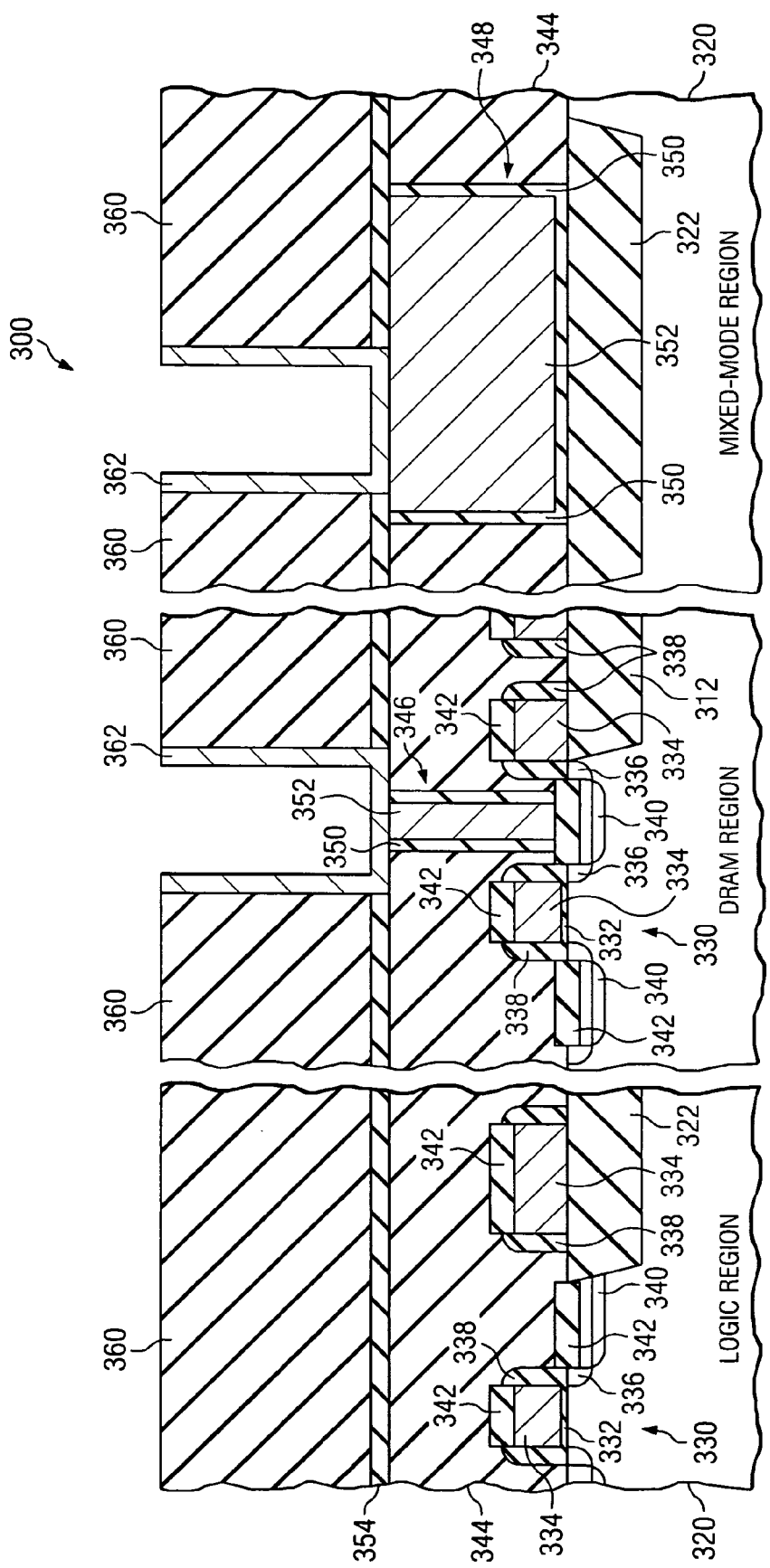

FIG. 3e illustrates wafer 300 of FIG. 3d after a second ILD 360 has been formed and bottom electrodes 362 have been formed therein for the storage capacitor in the DRAM region and the MIM capacitor in the mixed-mode. The second ILD 360 may comprise an oxide or a low-k dielectric material. In one embodiment, the second ILD 360 is an oxide formed by CVD techniques using TEOS and oxygen as a precursor. The second ILD 360 may be planarized and patterned in the same manner as discussed above with reference to the first ILD 344, except that the second ILD 360 is patterned to form the bottom electrodes 362 for the DRAM storage cell and the MIM capacitor.

The bottom electrodes 362 are preferably formed by depositing and patterning a layer of conductive material, preferably TiN, TaN, ruthenium, or the like. The conductive layer may be formed, for example, by CVD techniques and is preferably about 100 Å to about 500 Å in thickness, but more preferably about 200 Å in thickness. After the conductive layer is formed, the excess conductive material on the surface of the wafer 300 is removed by, for example, a CMP process or an etch back process wherein the second ILD 360 acts as an etch stop. As a result, the bottom electrodes 362 are formed as illustrated in FIG. 3e.

Figure 3F:
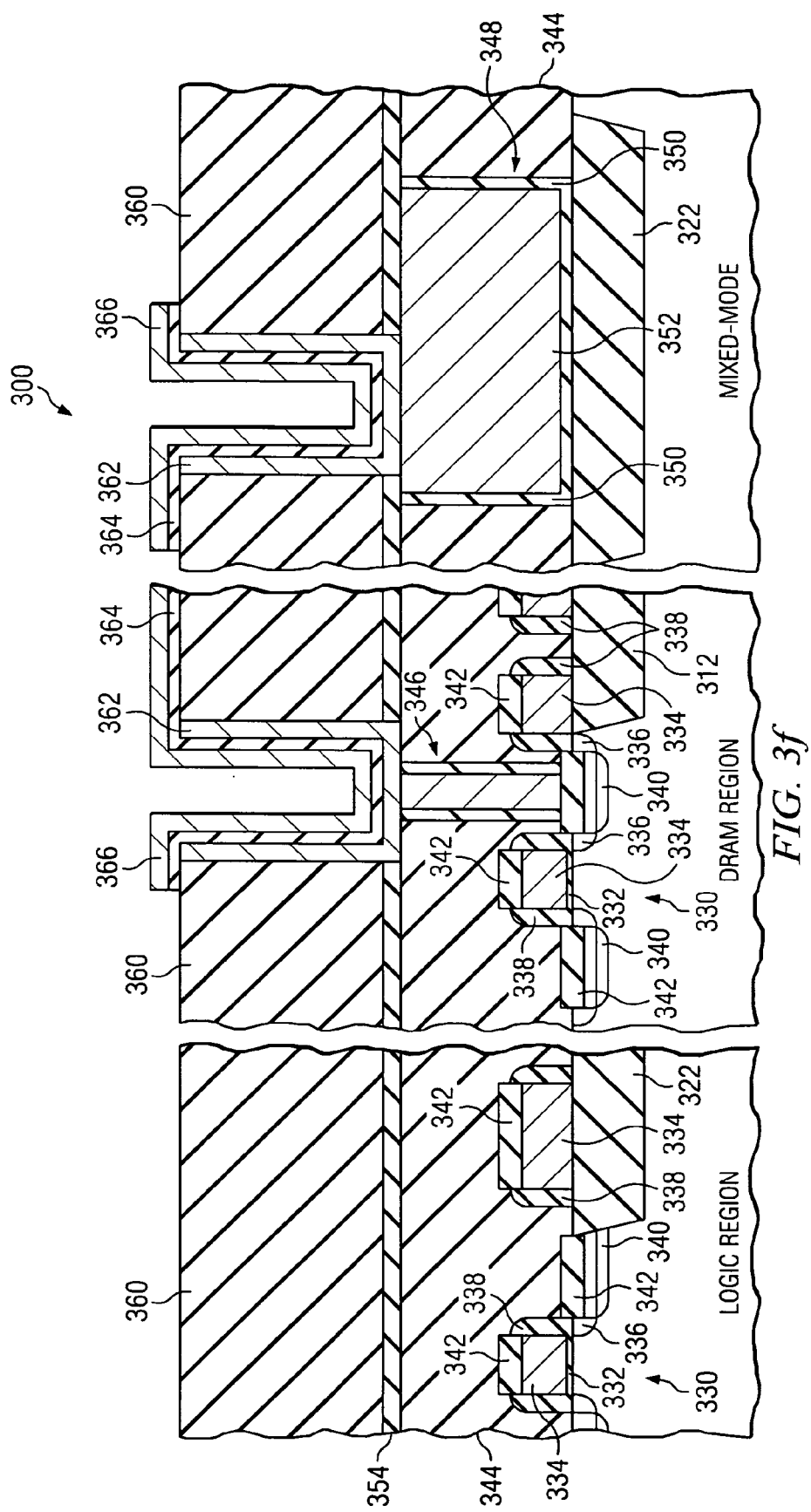

FIG. 3f illustrates the wafer 300 of FIG. 3e after dielectric buffers 364 and top electrodes 366 have been formed. The dielectric buffers 364 and the top electrodes 366 are preferably formed by depositing and patterning a dielectric layer and a conductive layer, respectively. The dielectric layer is preferably a high-K dielectric film, such as $Ta_2O_5$, $Al_2O_3$, $HFO_2$, BST, PZT, an oxide, other multi-layer high-K dielectric, or the like. The dielectric layer is preferably formed by CVD techniques and is preferably about 15 Å to about 200 Å in thickness, but more preferably about 110 Å in thickness.

The conductive layer is preferably a conductive material such as TiN, TaN, ruthenium, aluminum, tungsten, copper, or the like, and may be formed, for example, by CVD. The conductive layer is preferably about 100 Å to about 500 Å in thickness, but more preferably about 110 Å in thickness.

After the dielectric layer and the conductive layer are formed, the material is patterned, preferably in accordance with known photolithography and etching techniques. In the preferred embodiment wherein the conductive layer is formed of TiN and the dielectric layer is formed of $Ta_2O_5$, the dielectric buffers 364 and the top electrodes 366 may be patterned by performing, for example, an isotrophic dry etch.

Figure 3G:
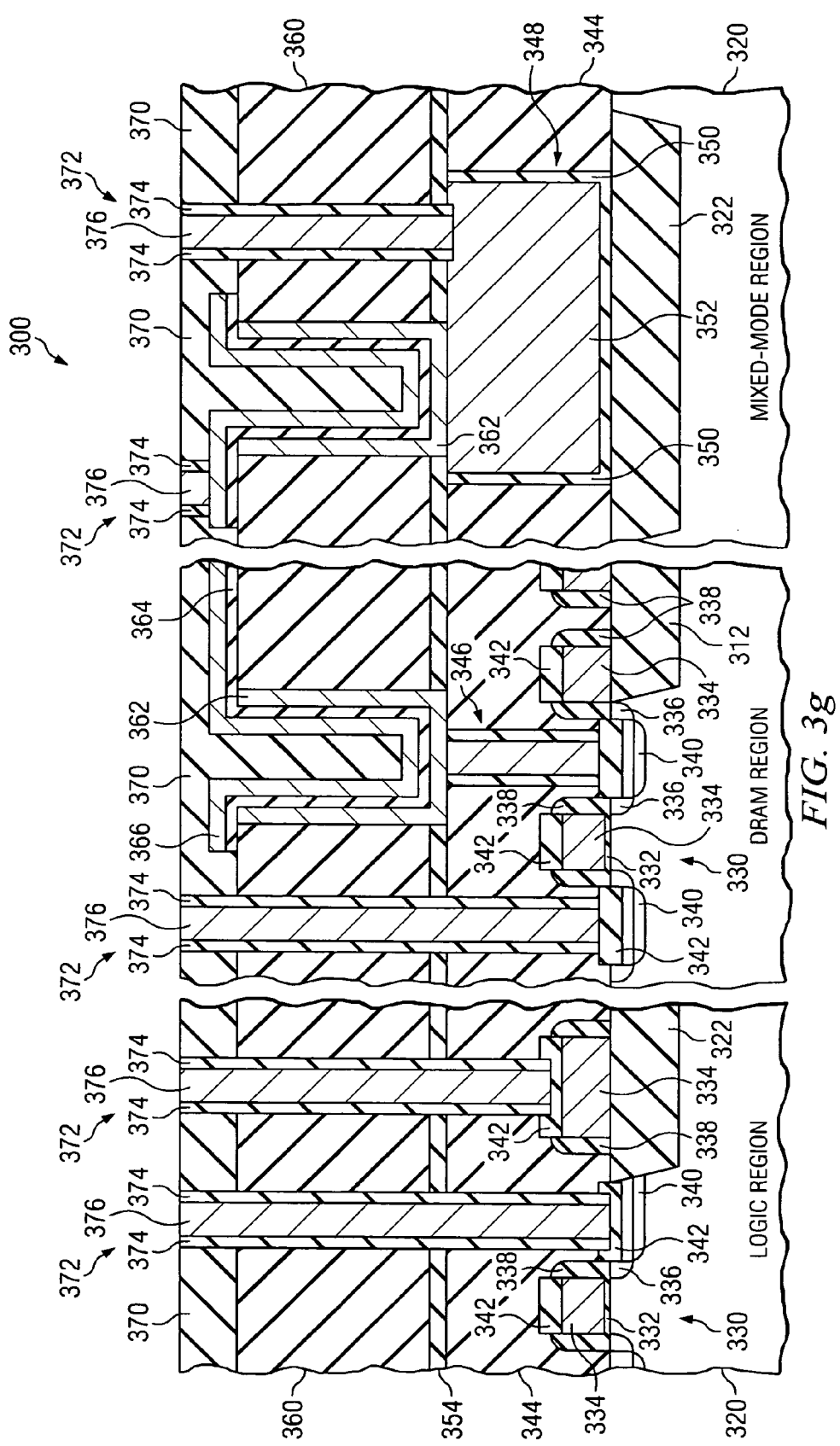

FIG. 3g illustrates wafer 300 of FIG. 3f after a third ILD 370 and contacts 372 have been formed. The third ILD 370 may be formed, planarized, and patterned in the same manner as discussed above with reference to the first ILD 344, except that the third ILD 370 is patterned to form contacts 372 to the bottom electrodes and the top electrodes. The third ILD 370 is preferably about 4000 Å in thickness.

After the third ELD 370 has been patterned, a barrier layer 374 is formed, and the contacts 372 are filled with a conductive material 376 using CVD techniques. Preferably, the barrier layer 374 and the contacts 372 are formed in the same manner as described above with reference to contacts 346 (FIG. 3d). Afterwards, the wafer 300 is planarized, preferably by a CMP process to the third ILD 370. Thereafter, standard processing techniques may be used to complete fabrication of the semiconductor wafer 300, such as, for example, testing, packaging, and the like.

FIGS. 4a–4g are cross-section views of a wafer 400 after various process steps illustrating another embodiment of the present invention in which a MIM capacitor is formed. The process begins in FIG. 4a, wherein a substrate 410 having a logic region, a DRAM region, and a mixed-mode region is provided as discussed above with reference to substrate 320 of FIG. 3a. STIs 412 may be formed on the substrate 410.

Figure 4A:
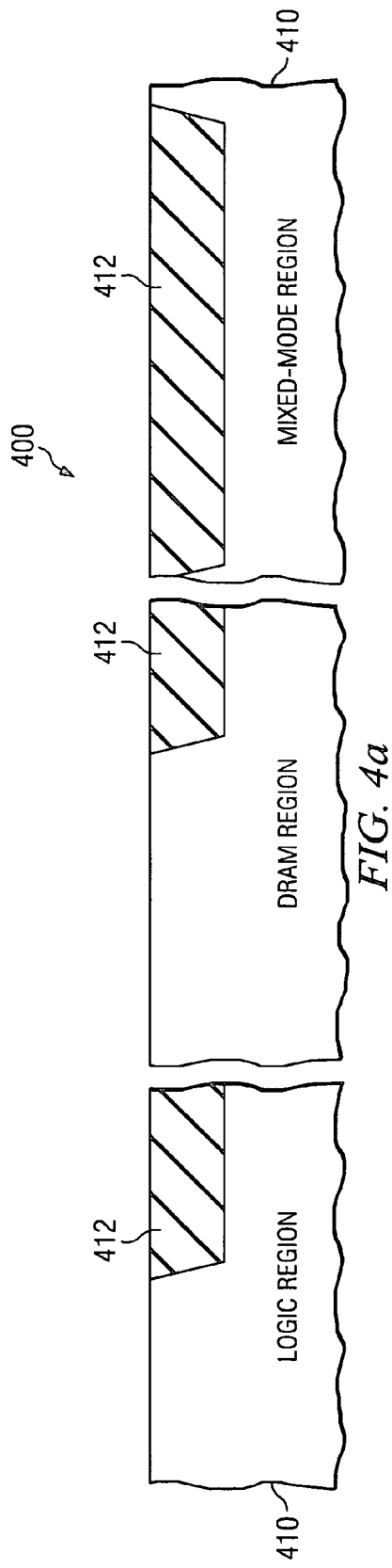
FIGS. 4a–4g are cross section views of a wafer after various process steps of a second method embodiment for fabricating a metal-insulator-metal capacitor in accordance with one embodiment of the present invention.
Figure 4B:
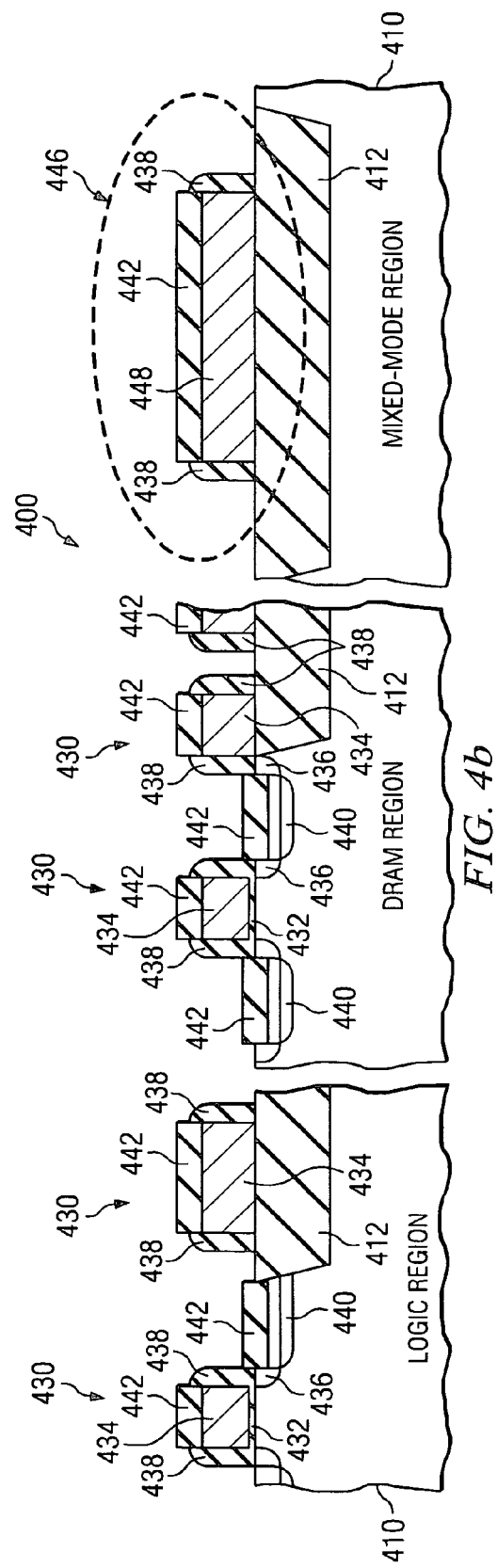

FIG. 4b illustrates wafer 400 of FIG. 4a after transistors 430 and a capacitor contact pad 446 have been formed. Generally, the formation of transistors 430 and the capacitor contact pad 446 involves first forming an oxide layer and a polysilicon layer on the substrate 410. The oxide layer is formed on the surface of the substrate 410 and will act as a gate dielectric 432 for the transistors 430. The polysilicon layer is formed on the oxide layer and will act as gate electrodes 434 for transistors 430 and as a polysilicon contact line 448 for the capacitor contact pad 446.

In the preferred embodiment, polysilicon is deposited undoped by low-pressure chemical vapor deposition (LPCVD) to a thickness in the range of about 1000 Å to about 4000 Å, but more preferably about 2000 Å. The oxide layer and the polysilicon layer are preferably patterned using standard photolithography and etching techniques to form the gate dielectric 432 and gate electrode 434 of the transistors 430 and the capacitor contact pad 446.

Next, a lightly-doped drain (LDD) implant region 436 is formed by implanting the substrate 410 with p-type or n-type ions, wherein the gate electrode 434 acts as a mask. Spacers 438 are formed and second implant region 440 is formed to complete formation of the source/drain regions of the transistors. Silicide regions 442 may be formed on the surface of the polysilicon and the source/drain regions to provide better contact and to lower contact resistance. It should be noted that the capacitor contact pad 446 is preferably doped during the ion implant process steps performed during the formation of the source/drain regions of the transistors 430.

Figure 4C:
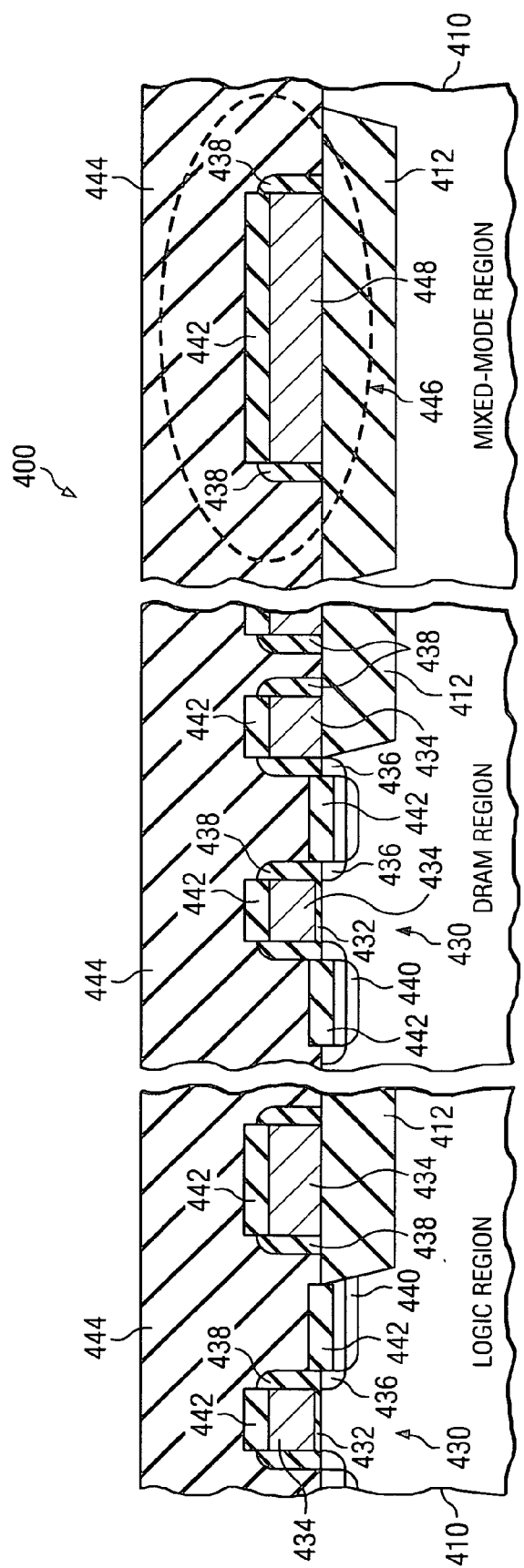

FIG. 4c illustrates the wafer 400 of FIG. 4b after a first interlayer dielectric (ILD) 444 has been formed. Preferably, the first WLD 444 comprises an oxide formed by CVD techniques using TEOS and oxygen as a precursor. Preferably, the first ILD 444 is about 4000 Å to about 13000 Å in thickness, but other thicknesses may be used. The surface of the first ILD 444 may be planarized, preferably by a CMP process using an oxide slurry.

Figure 4D:
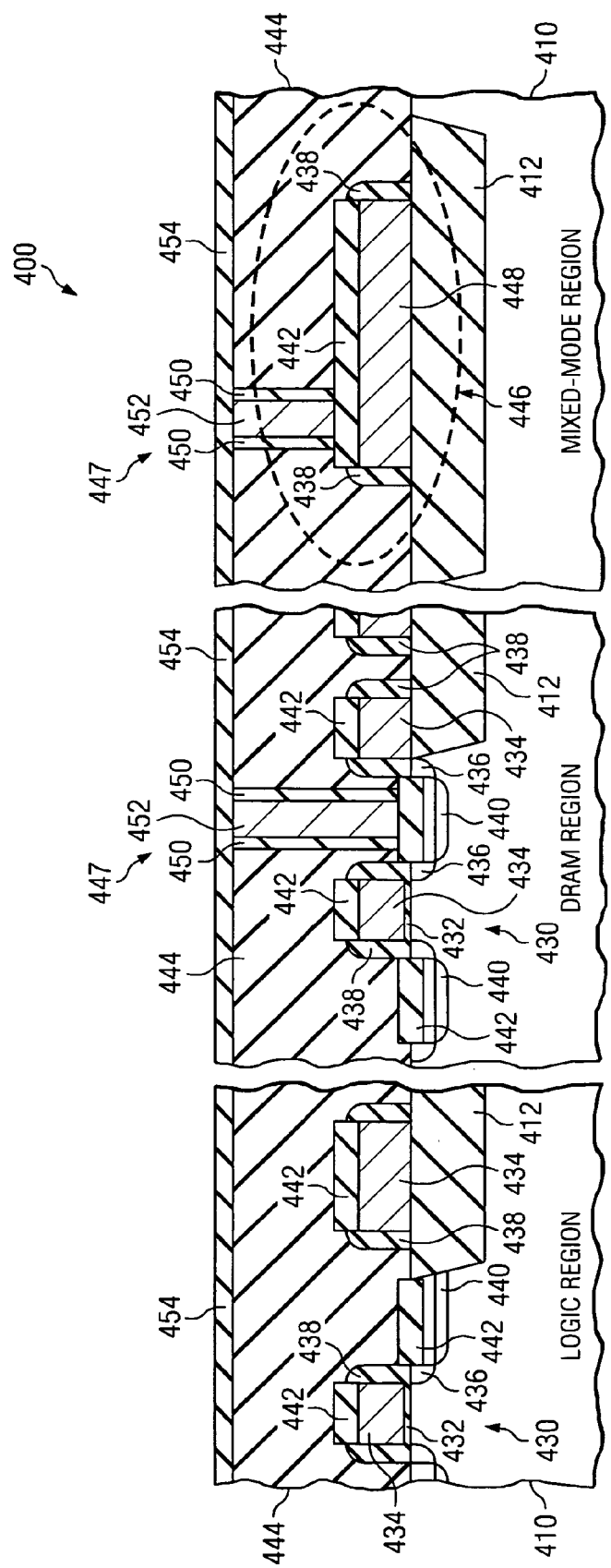

FIG. 4d illustrates the wafer 400 of FIG. 4c after contacts 447 have been formed. Preferably, the first WLD 444 is patterned in accordance with known photolithography and etching techniques. The etching process may be a wet or dry, anisotropic or isotropic etch process, but preferably is an anisotropic dry etch process.

After the first ILD 444 has been patterned, a barrier layer 450 is formed, and the contacts 447 are filled with a conductive material 452. The barrier layer 450 is preferably formed of titanium nitride, titanium and titanium nitride, or the like deposited by CVD techniques to a thickness of about 50 Å to about 350 Å. The conductive material 452 is preferably a highly conductive, low resistive metal, elemental metal, transistor metal, or the like, but preferably is tungsten. In the embodiment in which the conductive material 452 is tungsten, the conductive material may be deposited by CVD techniques known in the art.

Afterwards, the wafer 400 is planarized, preferably by a CMP process, to the surface of the first ILD 444. A stop layer 454 is formed over the planarized surface. Preferably, the stop layer 454 is a nitrogen-containing layer, such as $Si_3N_4$, $Si_xN_y$, silicon oxynitride $SiO_xN_y$, silicon oxime $SiO_xN_y{:}H_z$, or a combination thereof, formed using CVD techniques.

Figure 4E:
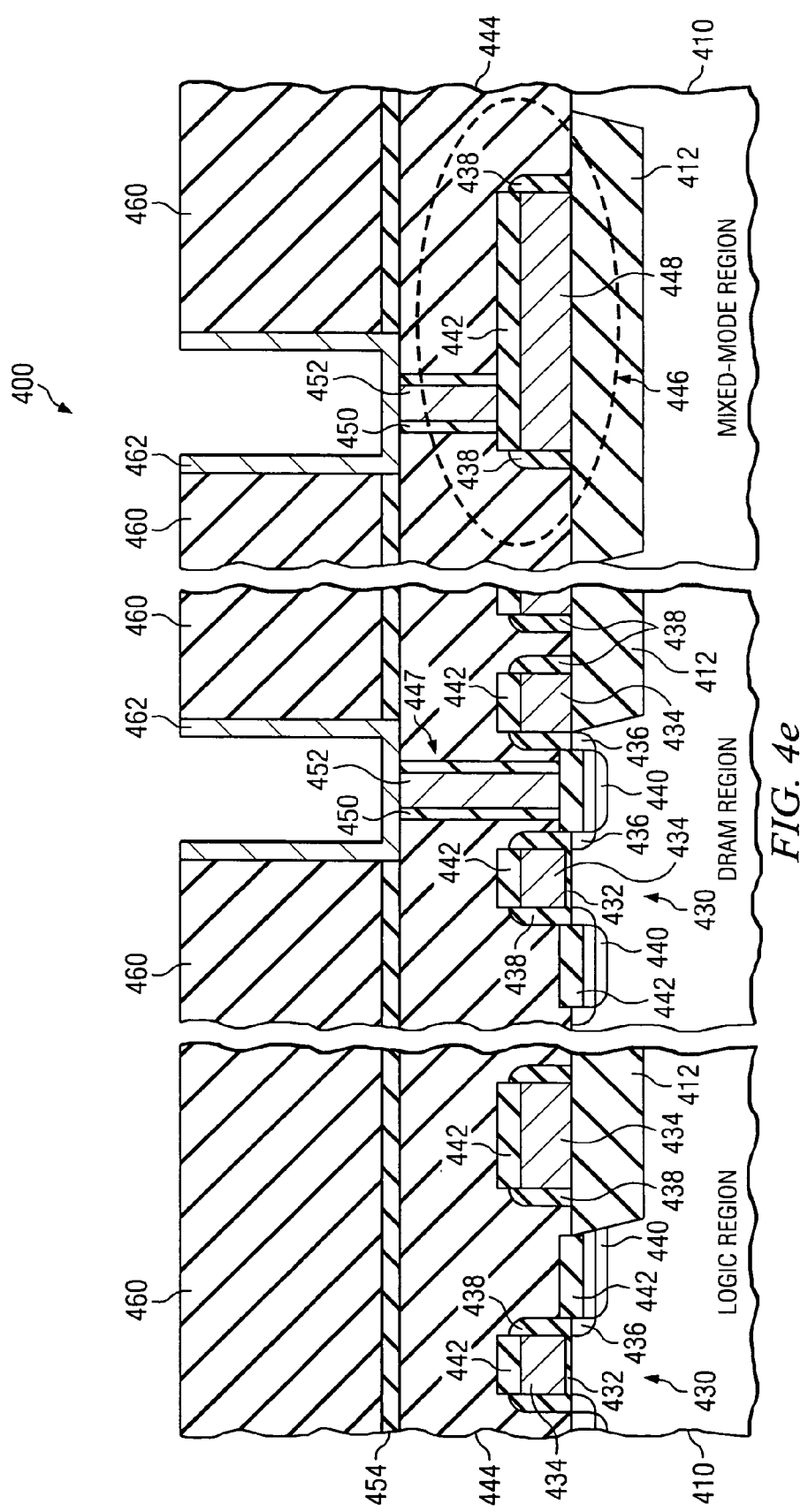

FIG. 4e illustrates wafer 400 of FIG. 4d after a second WLD 460 has been formed and bottom electrodes 462 for the storage capacitor for the DRAM cell and a mixed-mode capacitor have been formed therein. The second WLD 460 may be formed, planarized, and patterned in the same manner as discussed above with reference to the first ILD 444, except that the second ILD 446 is patterned to form the bottom electrodes 462 for the capacitor in the DRAM region and the mixed-mode region.

The bottom electrodes 462 are preferably formed by depositing and patterning a layer of conductive material, preferably TiN, TaN, ruthenium, aluminum, copper, tungsten, or the like. The conductive layer may be formed, for example, by CVD techniques and is preferably about 100 Å to about 500 Å in thickness, but more preferably about 200 Å in thickness. After the conductive layer is formed, the excess conductive material on the surface of the wafer 400 is removed, for example, by a CMP process or an etch back process wherein the second WLD 460 acts as an etch stop. As a result, the bottom electrodes 462 are formed as illustrated in FIG. 4e.

Figure 4F:
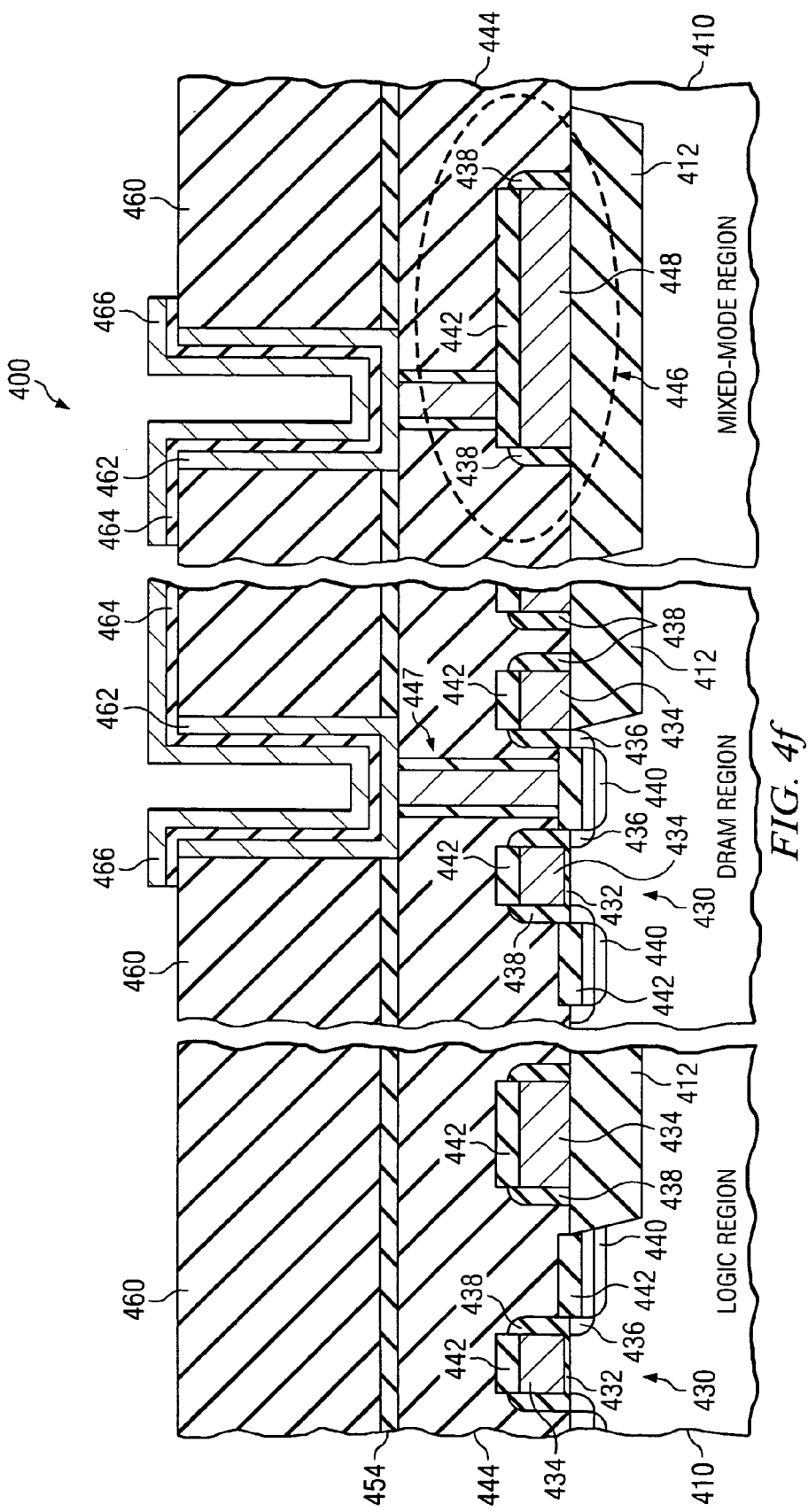

FIG. 4f illustrates the wafer 400 of FIG. 4e after dielectric buffers 464 and top electrodes 466 have been formed. The dielectric buffers 464 and the top electrodes 466 are preferably formed by depositing and patterning a dielectric layer and a conductive layer. The dielectric layer is preferably a high-K dielectric film, such as $Ta_2O_5$, $Al_2O_3$, $HFO_2$, BST, PZT, an oxide, other multi-layer high-K dielectric, or the like. The dielectric buffers 464 may be formed by CVD techniques and is preferably about 15 Å to about 200 Å in thickness, but more preferably about 110 Å in thickness.

The conductive layer is preferably a conductive material such as TiN, TaN, ruthenium, or the like, and may be formed, for example, by CVD. The conductive layer is preferably about 100 Å to about 500 Å in thickness, but more preferably about 200 Å in thickness.

After the dielectric layer and the conductive layer are formed, the material is patterned, preferably in accordance with known photolithography and etching techniques. In the preferred embodiment wherein the conductive layer is formed of TiN and the dielectric layer is formed of $Ta_2O_5$, the dielectric buffers 464 and the top electrodes 466 may be patterned by performing, for example, an anisotrophic dry etch process.

Figure 4G:
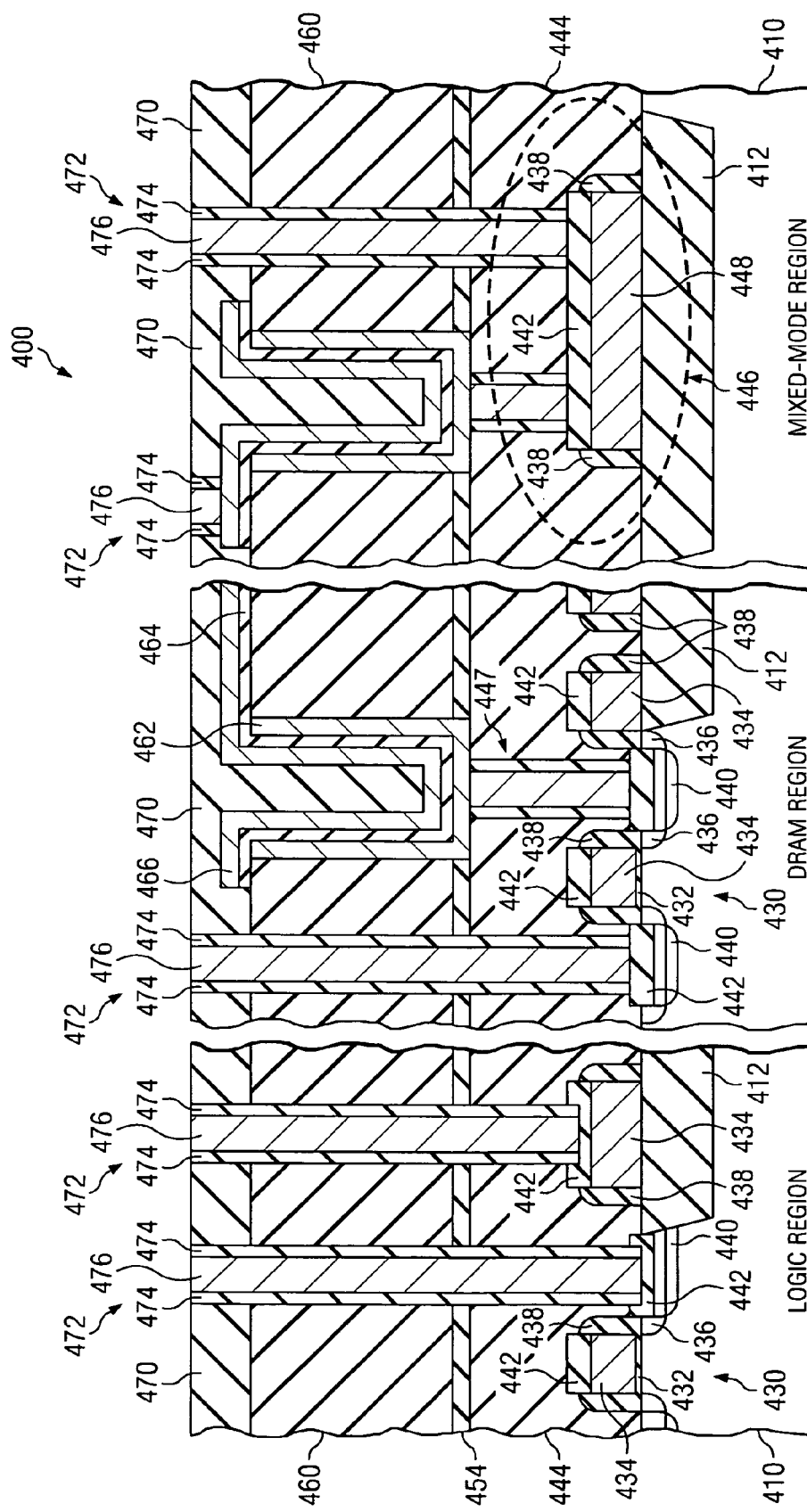

FIG. 4g illustrates wafer 400 of FIG. 4f after a third ILD 470 and contacts 472 have been formed. The third ILD 470 may be formed, planarized, and patterned in the same manner as discussed above with reference to the first ILD 444, except that the third ILD 470 is patterned to form contacts 472 to the bottom electrodes and the top electrodes. The third WLD 470 is preferably about 1000 Å to about 4000 Å in thickness.

After the third ILD 470 has been patterned, a barrier layer 474 is formed, and the contacts 472 are filled with a conductive material 476. Preferably, the barrier layer 474 and the contacts 472 are formed in the same manner as described above with reference to contacts 447 (FIG. 4d). Afterwards, the wafer 400 is planarized, preferably by a CMP process, to the surface of the third ILD 470. Thereafter, standard processing techniques may be used to complete fabrication of the semiconductor wafer 400, such as, for example, testing, packaging, and the like.

As one of ordinary skill in the art will appreciate, the embodiments described above provide semiconductor devices incorporating capacitors for mixed-mode signal processing or system-on-chip application. The fabrication of the additional capacitors is integrated with existing process steps such that no additional processing steps need to be performed. Accordingly, this provides a cost-efficient technique for fabrications of mixed-mode and system-on-chip semiconductor devices.

Although particular embodiments of the invention have been described in detail, it is understood that the invention is not limited correspondingly in scope, but includes all changes, modifications, and equivalents coming within the spirit and terms of the claims appended hereto. For example, different types of materials may be used for the masks and device layers, different etching processes may be used, other types of devices may be fabricated, other types of structures may be fabricated, and the like. Accordingly, it is understood that this invention may be extended to other structures and materials, and thus, the specification and figures are to be regarded in an illustrative rather than a restrictive sense.

Although the present invention and its advantages have been described in detail, it should be understood that various changes, substitutions and alterations can be made herein without departing from the spirit and scope of the invention as defined by the appended claims. For example, different types of materials may be used, different thicknesses may be used, and the like.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a substrate;
   forming a first interlayer dielectric on the substrate;
   forming a capacitor contact pad located in the first interlayer dielectric in a first region;
   forming a second interlayer dielectric on the first interlayer dielectric;
   forming an integrated capacitor having a first top electrode and a first bottom electrode formed in the second interlayer dielectric such that the first bottom electrode is in electrical contact with the capacitor contact pad, at least a portion of the integrated capacitor being positioned directly over the capacitor contact pad; and
   forming a capacitor contact pad contact through the second interlayer dielectric providing an electrical connection to the capacitor contact pad, at least a portion of the capacitor contact pad contact being positioned directly over the capacitor contact pad, wherein a portion of the capacitor contact pad directly under the integrated capacitor and a portion of the capacitor contact pad directly under the capacitor contact pad contact form a continuous contact region.

2. The method of claim 1, further comprising forming a device on a second region of the substrate before forming the first interlayer dielectric.

3. The method of claim 2, wherein the device is a transistor.

4. The method of claim 3, further comprising simultaneously forming a contact in the first interlayer dielectric when the step of forming a capacitor contact pad is performed, wherein the contact is electrically connected to the transistor.

5. The method of claim 4, further comprising simultaneously forming a storage capacitor in the second interlayer dielectric when the step of forming the integrated capacitor is performed, wherein the storage capacitor pad a second top electrode and a second bottom electrode formed such that the second bottom electrode is in electrical contact with the transistor via the contact.

6. The method of claim 4, wherein the capacitor contact pad and the contact are formed of a first material.

7. The method of claim 6, wherein the first material is a material selected from the group consisting of a metal, an elemental metal, a transition metal, and a combination thereof.

8. A method of forming a semiconductor device, the method comprising:

provopening a substrate having at least one first region and one second region;

forming a transistor on the first region;

forming a first interlayer dielectric over the substrate;

forming a capacitor contact pad in the first interlayer dielectric upon the second region, the capacitor contact pad being a thickness substantially equivalent to the thickness of the first interlayer dielectric;

forming a second interlayer dielectric on the first interlayer dielectric;

forming an integrated capacitor in the second interlayer dielectric upon the second region and a storage capacitor in the second interlayer dielectric upon the first region, the integrated capacitor having a first bottom electrode being in electrical contact with the capacitor contact and the storage capacitor having a second bottom electrode, the second bottom electrode being in electrical contact with the transistor, at least a portion of the integrated capacitor is positioned directly over the capacitor contact pad; and forming a capacitor contact pad contact in the second dielectric layer, at least a portion of the capacitor contact pad contact being in electrical contact with the capacitor contact pad and positioned directly over the capacitor contact pad, wherein a portion of the capacitor contact pad directly under the integrated capacitor and a portion of the capacitor contact pad directly under the capacitor contact pad contact from a continuous contact region.

9. The method of claim 8, further comprising simultaneously forming a transistor contact in the first interlayer dielectric when the step of forming the capacitor contact pad is performed, wherein the transistor contact electrically connects a source/drain of the transistor with the second bottom electrode.

10. The method of claim 9, wherein the transistor contact and the capacitor contact pad are formed of a first material.

11. The method of claim 10, wherein the first material is a material selected from the group consisting of a metal, an elemental metal, a transition metal, and a combination thereof.

12. The method of claim 8, wherein the capacitor contact pad is formed of a material selected from the group consisting of a metal, an elemental metal, a transition metal, and a combination thereof.

13. The method of claim 8, wherein forming the capacitor contact pad includes forming a barrier layer on the first interlayer dielectric and forming a conductive layer on the barrier layer.

14. The method of claim 13, wherein the barrier layer is formed of a material selected from the group consisting of titanium, titanium nitride, and combinations thereof.

15. The method of claim 13, wherein the conductive layer comprises tungsten.

* * * * *